(12) United States Patent
Kosugi

(10) Patent No.: US 7,852,458 B2
(45) Date of Patent: Dec. 14, 2010

(54) EXPOSURE APPARATUS

(75) Inventor: Yuji Kosugi, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 411 days.

(21) Appl. No.: 11/945,623

(22) Filed: Nov. 27, 2007

(65) Prior Publication Data

US 2008/0123075 A1     May 29, 2008

(30) Foreign Application Priority Data

Nov. 29, 2006   (JP) .............................. 2006-322518

(51) Int. Cl.
    *G03B 27/68* (2006.01)
    *G03B 27/52* (2006.01)
(52) U.S. Cl. .......................................... 355/52; 355/55
(58) Field of Classification Search .................. 355/52, 355/53, 55, 67; 250/548; 356/399–401
    See application file for complete search history.

(56) References Cited

U.S. PATENT DOCUMENTS 6,115,107 A * 9/2000 Nishi .......................... 355/68
6,304,317 B1 * 10/2001 Taniguchi et al. .............. 355/55
6,538,723 B2 * 3/2003 Hagiwara et al. .............. 355/67
7,257,453 B2 * 8/2007 Kemmoku .................. 700/100

FOREIGN PATENT DOCUMENTS

JP          10-116877          5/1998

* cited by examiner

*Primary Examiner*—Hung Henry Nguyen
(74) *Attorney, Agent, or Firm*—Rossi, Kimms & McDowell LLP

(57) ABSTRACT

An exposure apparatus includes a projection optical system for projecting light from a reticle onto a substrate, and exposes a shot region of the substrate to radiant energy via the reticle and the projection optical system. The exposure apparatus comprises a substrate stage configured to hold the substrate and to be moved, a console configured to set a valid area inside the shot region, a measuring device configured to measure a position of a surface of the substrate in a direction parallel to an optical axis of the projection optical system, and a controller configured to control a position of the substrate stage based on the position of the surface measured by the measuring device at a measurement point in the valid area set by the console, the measurement point being determined in accordance with a position of the substrate relative to the measuring device.

3 Claims, 16 Drawing Sheets

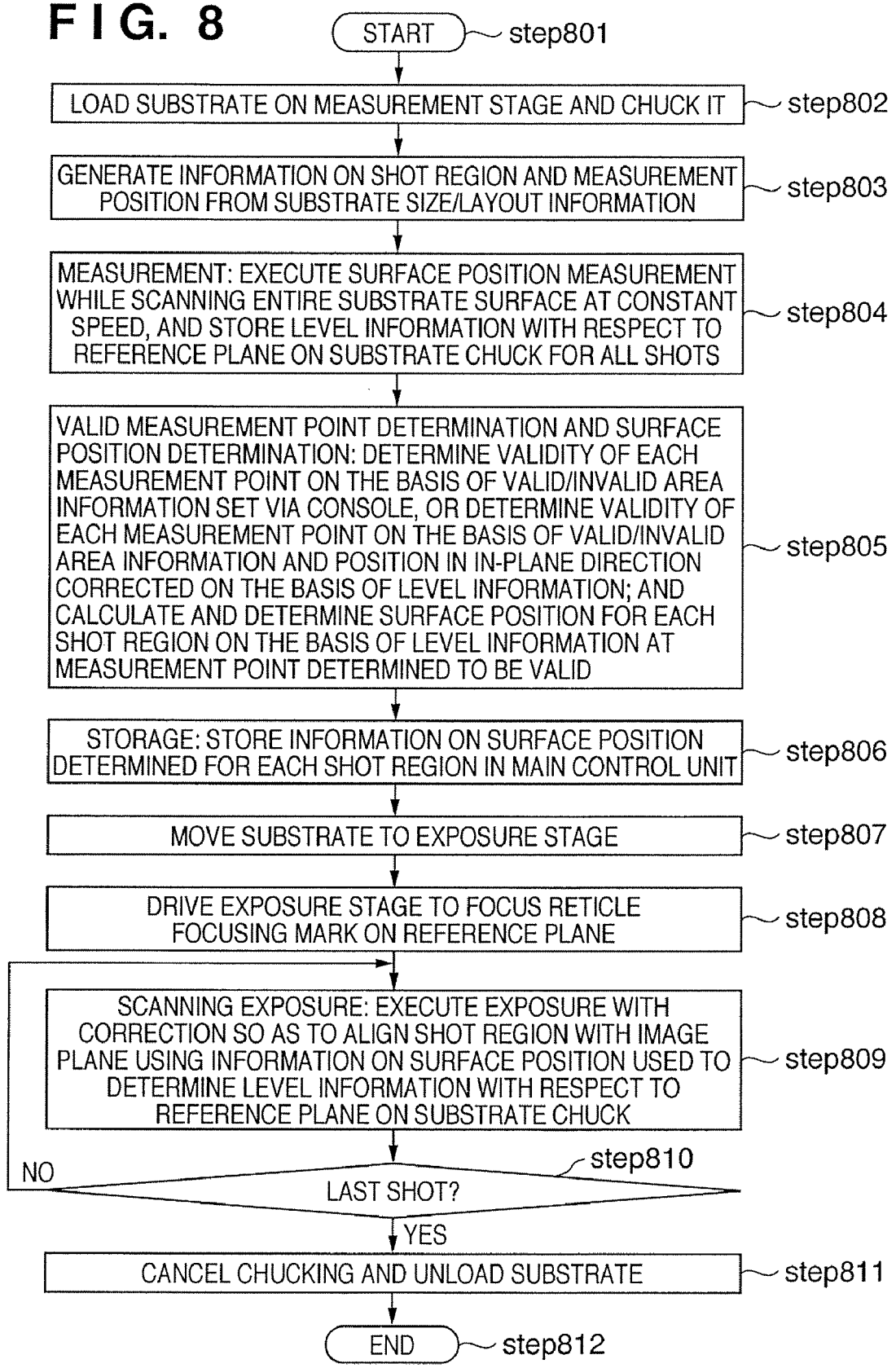

FIG. 9
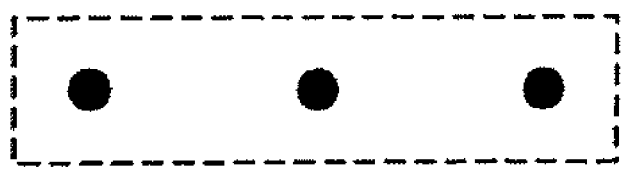
 — EXPOSURE SLIT
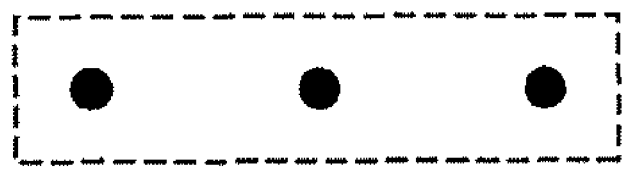
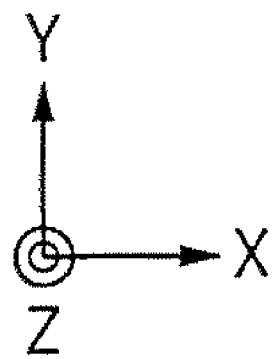

FIG. 10
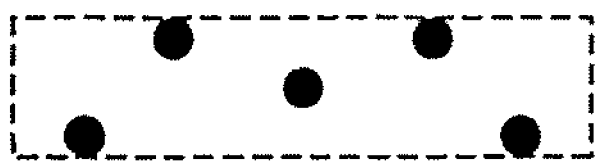
 EXPOSURE SLIT
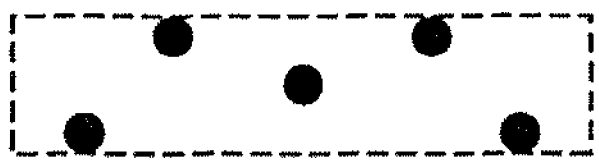
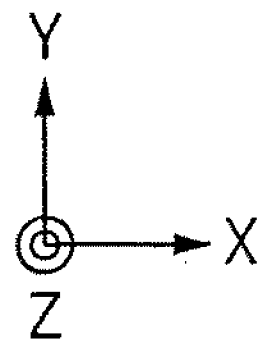

MEASUREMENT VALUE
INVALID AREA

MEASUREMENT VALUE
INVALID AREA

EXPOSURE APPARATUS

BACKGROUND OF THE INVENTION

1. Field of the Invention

The present invention relates to an exposure apparatus used to manufacture a device such as a semiconductor device.

2. Description of the Related Art

An exposure apparatus which exposes a substrate to radiant energy, such as light, via the pattern of a mask or reticle (to be generically referred to as a "reticle" hereinafter) and a projection optical system is used in lithographic process to manufacture, for example, a semiconductor device, liquid crystal display device, or thin-film magnetic head.

Along with the micropatterning and an increase in the density of integrated circuits, the exposure apparatus is required to project the circuit pattern on the reticle surface onto the substrate surface by exposure with high resolving power. The projection resolving power of the circuit pattern depends on the exposure wavelength and the numerical aperture (NA) of the projection optical system. In view of this, various efforts are made by increasing the NA of the projection optical system, changing the wavelength of the illumination light from the g-line to the i-line and from the i-line to the excimer laser oscillation wavelength, and shortening the excimer laser oscillation wavelength to 248 nm, 193 nm, and even 157 nm.

At the same time, the exposure area is increasing. A stepper and scanner are available as means for achieving this aim. The stepper reduces and projects roughly square shot regions onto a substrate by full plate exposure. The scanner accurately exposes relatively large rectangular or arcuated slit shot regions by relatively scanning the reticle and the substrate at high speed. Since the scanner aligns the surface position of the substrate for each slit region to be exposed to light with the image plane, it can reduce the influence of the substrate flatness. The scanner can also increase the shot region area and the NA using a lens equivalent to that of the stepper. Hence, the scanner is becoming the mainstream of the exposure apparatus.

A scanning exposure apparatus commonly called a scanner aligns, in real time, the substrate surface with the image plane in a slit to be scanned and exposed to light. For this purpose, the scanner measures the substrate surface position before the exposure slit using a gap sensor such as an oblique-incident-light surface position measuring device, air microsensor, or capacitance sensor, and moves the substrate. The exposure slit has a plurality of measurement points especially in the longitudinal direction (a direction perpendicular to the scanning direction) to measure not only the level but also the tilt of the surface.

Referring to FIG. 9, three measurement points of the surface position measuring device are provided before and after a scanning exposure slit. Referring to FIG. 10, five measurement points are provided. Providing measurement points before and after the slit allows substrate surface position measurement before exposure irrespective of whether the exposure scanning direction is positive or negative.

There is proposed a method of attaining high focus correction accuracy with respect to the depth of focus in reduction, thus improving the yield per substrate. This method calculates the substrate surface position in advance using a surface position measuring device arranged separately from the exposure apparatus, and drives the substrate under focus/tilt control using the calculated surface position.

When rectangular shot regions are sequentially transferred onto a circular substrate, some shot regions may partially fall outside the substrate in its periphery, as shown in FIG. 5. As shown in FIG. 6, even in a so-called multichip arrangement in which a plurality of chips constitute a shot region, some chips may fall outside the substrate in its periphery. This makes it necessary to expose a shot region 501 (non-rectangular portion), which partially falls outside the substrate, to light by the usual method.

When one chip constitutes a shot region as in a CPU, a photoresist remaining on the periphery of the substrate is removed upon clamping the substrate surface by, for example, ion implantation and RIE. The removed photoresist may transfer to the pattern of a chip, causing a pattern defect or dimensional error. This degrades the chip yield, so non-rectangular portions are also exposed to light to remove any unnecessary resist.

There is a method of determining, in advance, the validity of a measurement point where the substrate surface position is measured in scanning measurement from layout information of, for example, a substrate and chip, and measuring and correcting the focus while dynamically switching a surface position measuring sensor during scanning exposure. This method attains accurate surface position measurement and favorable exposure in a non-rectangular shot region which partially falls outside the substrate in its periphery. Japanese Patent Laid-Open No. 10-116877 discloses this method.

However, along with the recent spread of the network society, a stricter demand has arisen for LSIs with high performances (e.g., an increase in the degree of integration, reduction in chip size, high speed, and low power consumption). To meet this demand, more micropatterned and multilayered interconnections have been developed for each generation in accordance with the International Technology Roadmap for Semiconductors (ITRS). This poses a new problem associated with the accuracy of aligning the substrate surface to be exposed to light with a best image plane, because the depth of focus extremely decreases along with the trend toward micropatterning. The surface position measurement accuracy in a shot region suffers particularly when the substrate has a large variance of the surface shape (low flatness).

The control requirement for the substrate flatness is generally $1/10$ to $1/5$ the depth of focus of an exposure apparatus. If the depth of focus is 0.4 µm, an in-plane variation occurs on the order of 0.04 µm to 0.08 µm. As shown in FIG. 11, assume that the substrate is driven based on information on measurement points FP1 to FP3 arranged at a predetermined interval. Since information on the substrate surface position is absent between the measurement points, it is defocused by an amount of shift Δ from a plane calculated from the measurement points FP1 to FP3. This problem is also attributed to a so-called focus sampling error.

To solve this problem, the influence of a focus accuracy variation may be reduced by minimizing the focus sampling interval and forming a multi-point surface position measuring device which strictly controls the positions of measurement points. However, the mechanical tolerance/adjustment tolerance increases in proportion to an increase in the number of surface position measurement points. This raises the degree of manufacturing difficulty, resulting in an increase in cost in a broad sense. The mechanical tolerance/adjustment tolerance of a multi-point surface position measurement position on the substrate is directly translated into an individual variation for each apparatus. For example, in an underlying pattern with a large difference in reflectance as represented by a copper interconnection, a small difference between measurement positions varies the focus correction accuracy.

SUMMARY OF THE INVENTION

It is an object of the present invention to provide, for example, an exposure apparatus which can accurately align the substrate surface with the image plane.

According to the present invention, there is provided an exposure apparatus which includes a projection optical system for projecting light from a reticle onto a substrate, and exposes a shot region of the substrate to radiant energy via the reticle and the projection optical system, the apparatus comprising a substrate stage configured to hold the substrate and to be moved, a console configured to set a valid area inside the shot region, a measuring device configured to measure a position of a surface of the substrate in a direction parallel to an optical axis of the projection optical system, and a controller configured to control a position of the substrate stage based on the position of the surface measured by the measuring device at a measurement point in the valid area set by the console, the measurement point being determined in accordance with a position of the substrate relative to the measuring device.

According to the present invention, it is possible to provide, for example, an exposure apparatus which can accurately align the substrate surface with the image plane.

Further features of the present invention will become apparent from the following description of exemplary embodiments with reference to the attached drawings.

BRIEF DESCRIPTION OF THE DRAWINGS

FIG. 8 is a flowchart showing a schematic example of a surface position determination sequence;

FIG. 9 is a plan view showing the schematic optical arrangement of a conventional surface position measuring device using three points in an exposure slit;

FIG. 10 is a plan view showing the schematic optical arrangement of a conventional surface position measuring device using five points in an exposure slit;

DESCRIPTION OF THE EMBODIMENTS

An embodiment according to the present invention will be described below with reference to the accompanying drawings.

Embodiment of Exposure Apparatus

Figure 1:
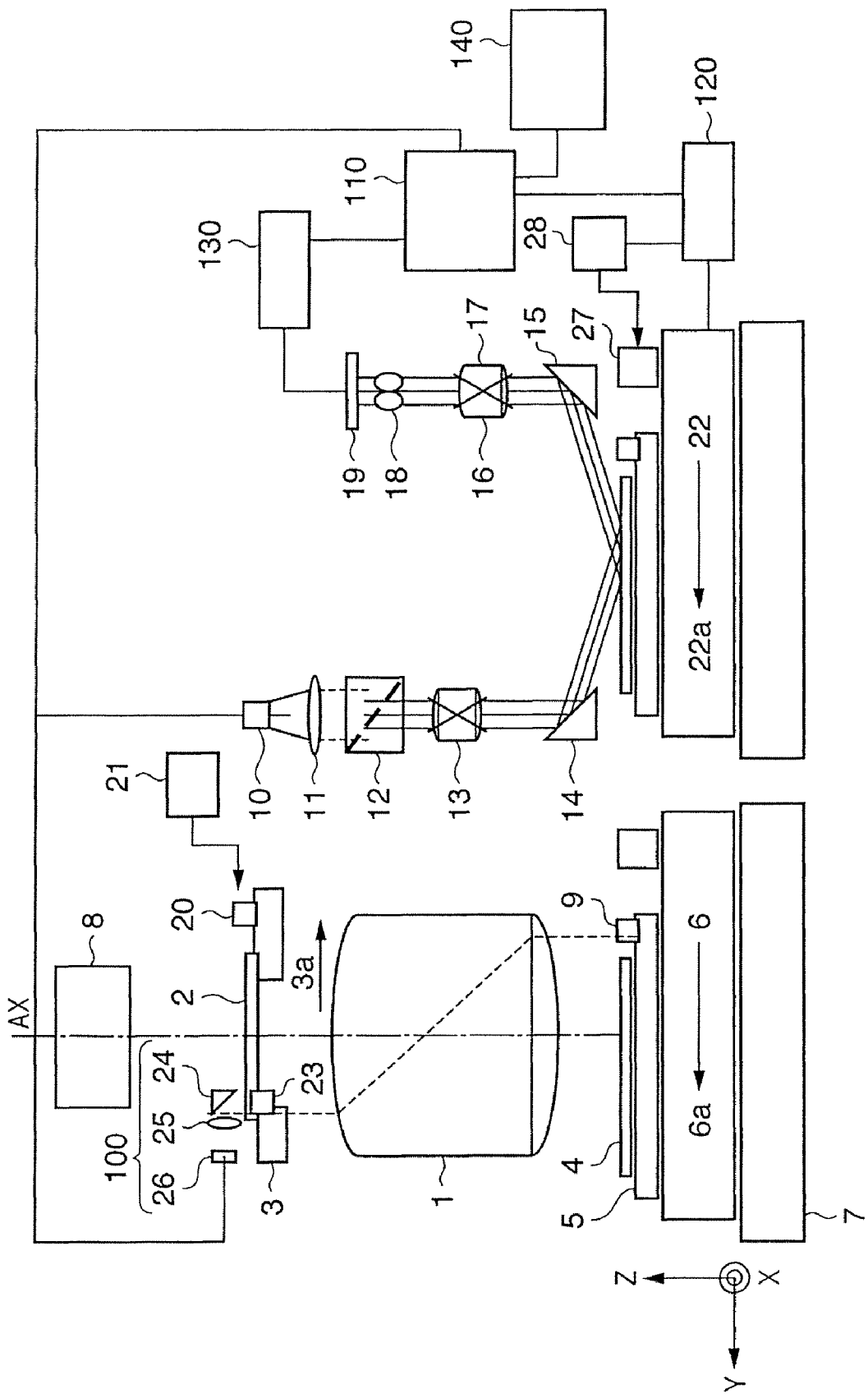
FIG. 1 is a schematic partial view showing an example of a projection exposure apparatus of a slit/scan scheme.

FIG. 1 is a schematic partial view showing a projection exposure apparatus of a slit/scan scheme. A reticle 2 is held on a reticle stage 3. The pattern of the reticle 2 is reduced and projected onto the image plane at a magnification of ¼, ½, or ⅕ of a reduction projection lens system 1, and forms an image on it.

A large number of shot regions having the same pattern structure formed in the previous exposure process are arrayed on a substrate 4 having a surface coated with a resist. A substrate chuck 5 serving as a holding jig chucks and fixes the substrate 4. A substrate stage 6 fixes the substrate chuck 5. The substrate stage 6 can be formed by an X-Y stage, a leveling stage which can move in the Z-axis direction and rotate about the X- and Y-axes, and a rotary stage which can rotate about the Z-axis. The substrate stage 6 (to be referred to as an "exposure stage" hereinafter) is arranged on a surface plate 7. The substrate stage 6 forms a 6-axis adjusting system for matching the reticle pattern image with the shot regions on the substrate.

First level measuring devices 10 to 19 are constituent elements of a measuring optical system which serves to measure the surface position and tilt of the substrate 4. A light source 10 includes an illumination unit which emits a light beam using a white lamp or a high luminance light emitting diode having a plurality of different peak wavelengths. A collimator lens 11 collimates the light beam from the light source 10 into a parallel beam having a section that exhibits a roughly uniform intensity distribution. A prism-shaped slit member 12 is formed by bonding a pair of prisms such that their tilted planes face each other, and forming a plurality of openings (e.g., 25 pinholes) in this bonding surface using a light shielding film made of, for example, chromium. A bilateral telecentric optical system 13 guides 25 independent light beams having passed through the plurality of pinholes in the slit member 12 to 25 measurement spots on the surface of the substrate 4 via a mirror 14. Although only one light beam is shown in FIG. 1, 25 light beams are present in a direction perpendicular to the sheet surface in practice. A plane in which the pinholes are formed and a plane which includes the surface of the substrate 4 satisfy the Scheimpflug condition with respect to the optical system 13.

Figure 2:
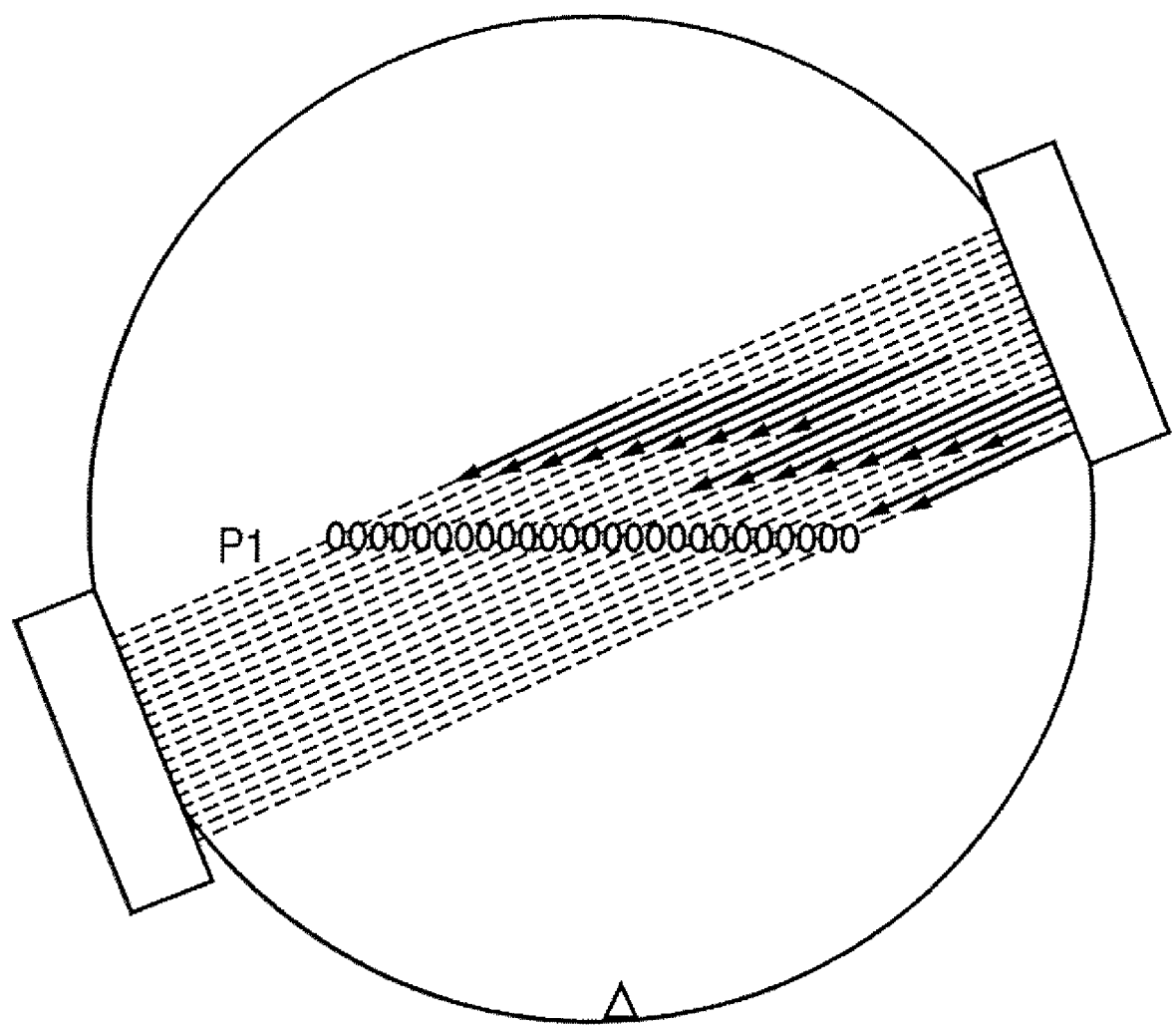
FIG. 2 is an explanatory view showing the positional relationship between an exposure slit and each measurement point in surface position measurement by a measuring optical system.
Figure 3:
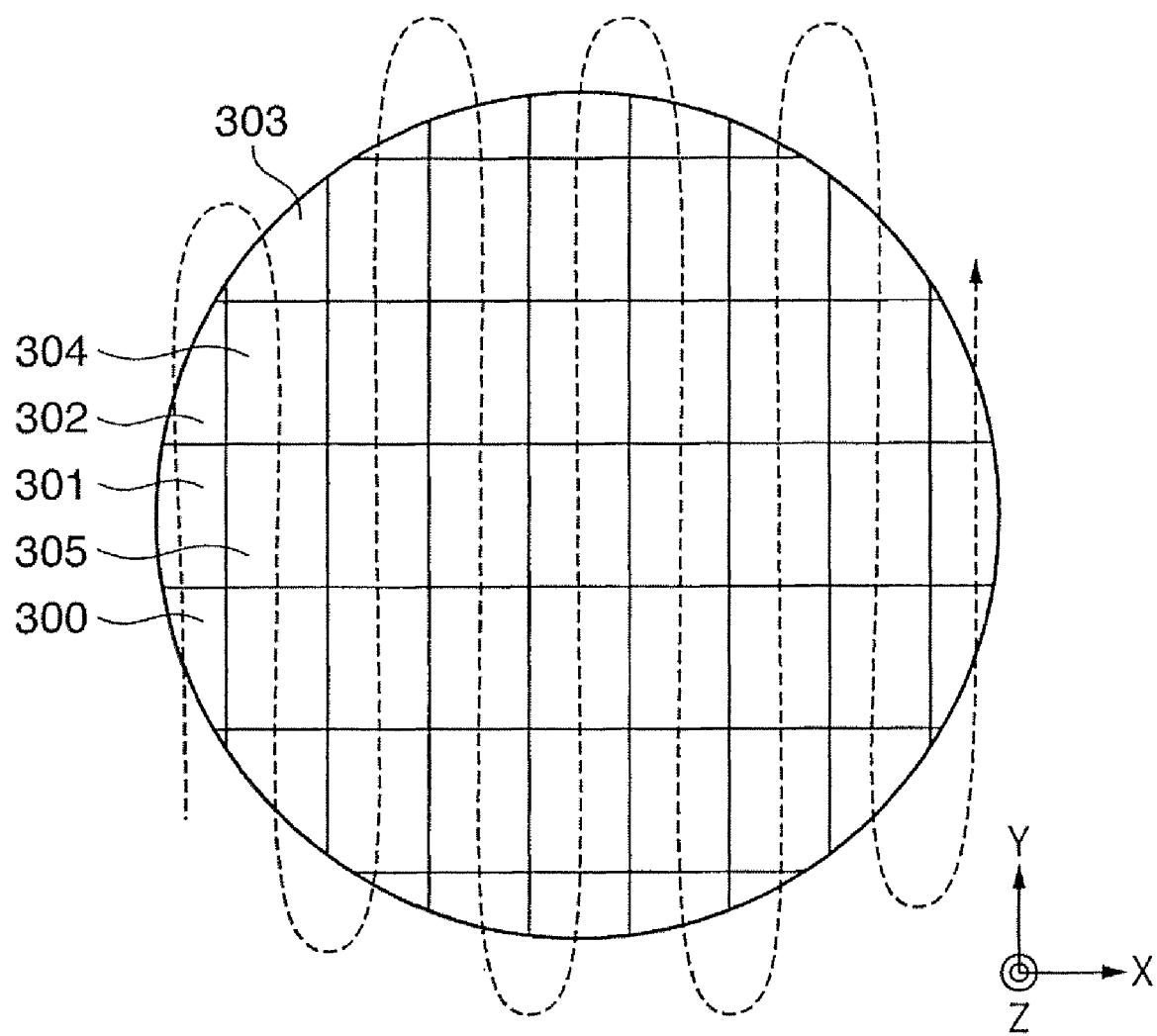
FIG. 3 is an explanatory view showing the measurement order of shot regions on a substrate.

In this embodiment, an incident angle Φ (the angle with respect to a line perpendicular to the substrate surface, i.e., with respect to the optical axis) of each light beam from the light irradiation means on the surface of the substrate 4 is 70° or more. As shown in FIG. 3, a plurality of shot regions having the same pattern structure are arrayed on the surface of the substrate 4. As shown in FIG. 2, the 25 light beams having passed through the optical system 13 are guided and imaged on independent measurement spots in the pattern region. The 25 measurement spots in FIG. 2 align in the X direction over a length almost equal to or longer than the width of the exposure slit in the exposure stage in the non-scanning direction. When, for example, the 25 measurement spots align over a length twice the width of the exposure slit in the exposure stage, it is possible to simultaneously execute measurement in at least two shot regions. This shortens the time taken to execute measurement in all the shot regions. The 25 light beams strike the 25 measurement spots in a direction obtained by rotating the X direction (scanning direction 6a) through $\theta°$ (e.g., 22.5°) within the X-Y plane to make it possible to observe them independently in the surface of the substrate 4.

A bilateral telecentric light receiving optical system 16 receives the 25 light beams, which are reflected by the surface of the substrate 4, via a mirror 15. A stopper aperture 17 built in the light receiving optical system 16 is commonly used for the 25 measurement spots, and cuts higher-order diffraction light (noise light) generated by the circuit pattern on the substrate 4. Twenty-five separate correction lenses of correction optical systems 18 image the light beams having passed through the bilateral telecentric light receiving optical system 16 on the measurement surface of photoelectric conversion devices 19 again to form them into spot light beams having the same size. The light receiving elements 16 to 18 perform tilt correction such that each measurement spot on the surface of the substrate 4 becomes conjugate to the measurement surface of the photoelectric conversion devices 19. For this reason, the position of a pinhole image on the measurement surface changes in response to a change in level at each measurement spot in an optical axis direction AX without depending on a local tilt at each measurement spot. Although the photoelectric conversion devices 19 are, for example, 25 one-dimensional CCD line sensors in this embodiment, they may be a plurality of two-dimensional position measuring devices.

The reticle 2 that is chucked and fixed to the reticle stage 3 is scanned in the direction (Y-axis direction) indicated by an arrow 3a shown in FIG. 1 at a constant speed. At the same time, the reticle 2 is driven in a direction (X-axis direction) perpendicular to the direction indicated by the arrow 3a with correction so as to scan it while maintaining a target coordinate position. A plurality of laser beams are guided from an external reticle interferometer 21 to an X-Y bar mirror 20 fixed to the reticle stage 3, to always measure the position information of the reticle stage 3 in the X and Y directions.

An illumination optical system 8 can be formed by members such as a light source, for example, an excimer laser which generates pulse light, a beam shaping optical system, an optical integrator, a collimator, and a mirror. The illumination optical system 8 can be made of a material which efficiently transmits or reflects pulse light in a far-ultraviolet region. The beam shaping optical system shapes the shape (including the dimension) of the section of an incident beam into a desired shape. The optical integrator uniforms the light intensity distribution characteristic of a light beam to illuminate the reticle 2 with a uniform illuminance.

A masking blade in the illumination optical system 8 sets a rectangular illumination region corresponding to the chip size. The pattern on the reticle 2 partially illuminated in the illumination region is projected onto the substrate 4 coated with a resist via the reduction projection lens system 1. The exposure system according to this embodiment includes the elements 1 to 8 from the reduction projection optical system 1 to the illumination optical system 8.

A reference plane 9 is formed on a part of the substrate chuck 5. A measurement stage 22 for another exposure and measurement which can freely move in the six axial directions, like the exposure stage 6, is arranged on the surface plate 7 or on a separately provided surface plate. The substrate chuck 5 and substrate 4 are initially set on the measurement stage 22.

The first level measuring devices measure the level of each chip or an arbitrary chip on the substrate 4 with respect to the reference plane 9 on the substrate chuck 5 while being set on the measurement stage 22, and store the measurement data in a memory 130. The reference plane 9 on the substrate chuck 5 can be formed using, for example, a metallic thin film or metallic plate such that it becomes nearly flush with the substrate 4 to increase the measurement accuracy.

In this embodiment, the substrate 4 moves on the exposure stage 6 while being chucked by the substrate chuck 5 by, for example, vacuum suction or static electricity. A focusing operation is performed to position the substrate 4 on a predetermined plane. A second level measuring device 100 performs a focusing operation corresponding to level measurement using the reference plane 9. For example, the second level measuring device 100 performs a focusing operation using the reference plane 9 and a focusing mark 23 formed in a potential exposure region (circuit pattern) on the reticle 2 or on a boundary line in it. The mark 23 is formed by, for example, a pinhole through which the light from the illumination optical system 8 passes and forms an image near the reference plane 9 on the substrate chuck 5 via the projection optical system 1. The light reflected by the reference plane 9 forms an image near the mark 23 via the projection optical system 1 again. When the reticle 2 is completely focused on the reference plane 9, a maximum amount of light passes through the pinhole of the mark 23. A measuring device 26 measures the maximum light amount using a half mirror 24 and a condenser lens 25 while driving a Z stage, and inputs the measurement result to a main control unit 110. The main control unit 110 controls the stage position (in the Z direction) via a driver 120 such that the exposure stage 6 stops at a position where the maximum light amount is obtained.

The driver 120 moves the exposure stage 6 within the X-Y plane to sequentially move chips on the substrate surface to an exposure position in accordance with various types of preliminary information set via a console 140. The main control unit 110 receives the level of each chip with respect to the reference plane 9 on the surface of the substrate 4, which is previously measured on the measurement stage 22 and stored in the memory 130. On the basis of the level, the driver 120 drives the Z stage of the exposure stage 6 to move each chip to the in-focus position. After that, exposure is performed.

A surface position measurement method and exposure method according to this embodiment will be explained with reference to the flowchart illustrated in FIG. 8.

The apparatus shown in FIG. 1 uses, for example, a light emitting diode (LED) as the light source 10 and uses, for example, a primary CCD sensor as the light receiving unit.

In step 801, the main control unit 110 starts control. In step 802, the main control unit 110 controls a conveyance hand (not shown) to load the substrate 4 on the measurement stage 22, and controls the substrate chuck 5 to chuck and fix it. In step 803, the main control unit 110 calculates the measurement interval in a shot region and the amount of change in measurement timing between adjacent shot regions from substrate size/layout information, and stores them as measurement position information. Examples of the substrate size/layout information can be various types of preliminary information set via the console 140, the size of a scan measurement region, shot region layout information, the scan speed, and the CCD accumulation time.

In step 804, the main control unit 110 controls, for example, the first level measuring devices 10 to 19 to execute measurement over the entire substrate on the measurement stage 22 in the order as shown in FIG. 3 in synchronism with scanning. That is, the main control unit 110 accelerates the stage before a shot region 300 until it reaches a predetermined speed. After that, the main control unit 110 continuously executes measurement at measurement points in the shot region 300 by scanning at a constant speed and then continuously executes measurement at measurement points in shot regions 301 and 302. After the main control unit 110 completes measurement in the shot region 302, it immediately decelerates the stage. At the same time, the main control unit 110 starts moving the stage in the X direction to an adjacent column. The main control unit 110 accelerates the stage before a shot region 303 until it reaches a predetermined speed. After that, the main control unit 110 continuously executes measurement in a plurality of shot regions in the Y direction, that is, the shot region 303 and shot regions 304 and 305 by scanning at a constant speed. That is, the main control unit 110 repeats the following operation. After the main control unit 110 completes measurement in a predetermined range, it immediately decelerates the stage. At the same time, the main control unit 110 moves the stage in the X direction to an adjacent column until it reaches the acceleration start point. After that, the main control unit 110 accelerates the stage in the opposite direction and continuously executes measurement at measurement points in a plurality of shot regions in the Y direction by scanning at a constant speed. This obviates the need for accelerating/decelerating the stage for each shot region, thus attaining surface position measurement over the entire substrate surface within a short period of time. The memory 130 stores the level of the entire substrate surface.

In step 805, a controller 111 of the main control unit 110 determines a valid measurement point and the surface position. First, the controller 111 corrects the substrate position in the in-plane direction based on the surface position at each measurement point, which is measured by the first level measuring devices. Second, the controller 111 specifies a measurement point in a valid area based on information (to be described later) on valid areas in each shot region or based on this information and its corrected position in the in-plane direction. Third, the controller 111 determines the surface position for each shot region based on the surface position at each measurement point determined to fall within a valid area. The controller 111 executes at least the second and third functions of the above-described three functions.

A method of determining a valid measurement point by the controller 111 will be explained in detail with reference to FIGS. 4 to 7A, 7B, 12, 13A, and 13B.

Figure 5:
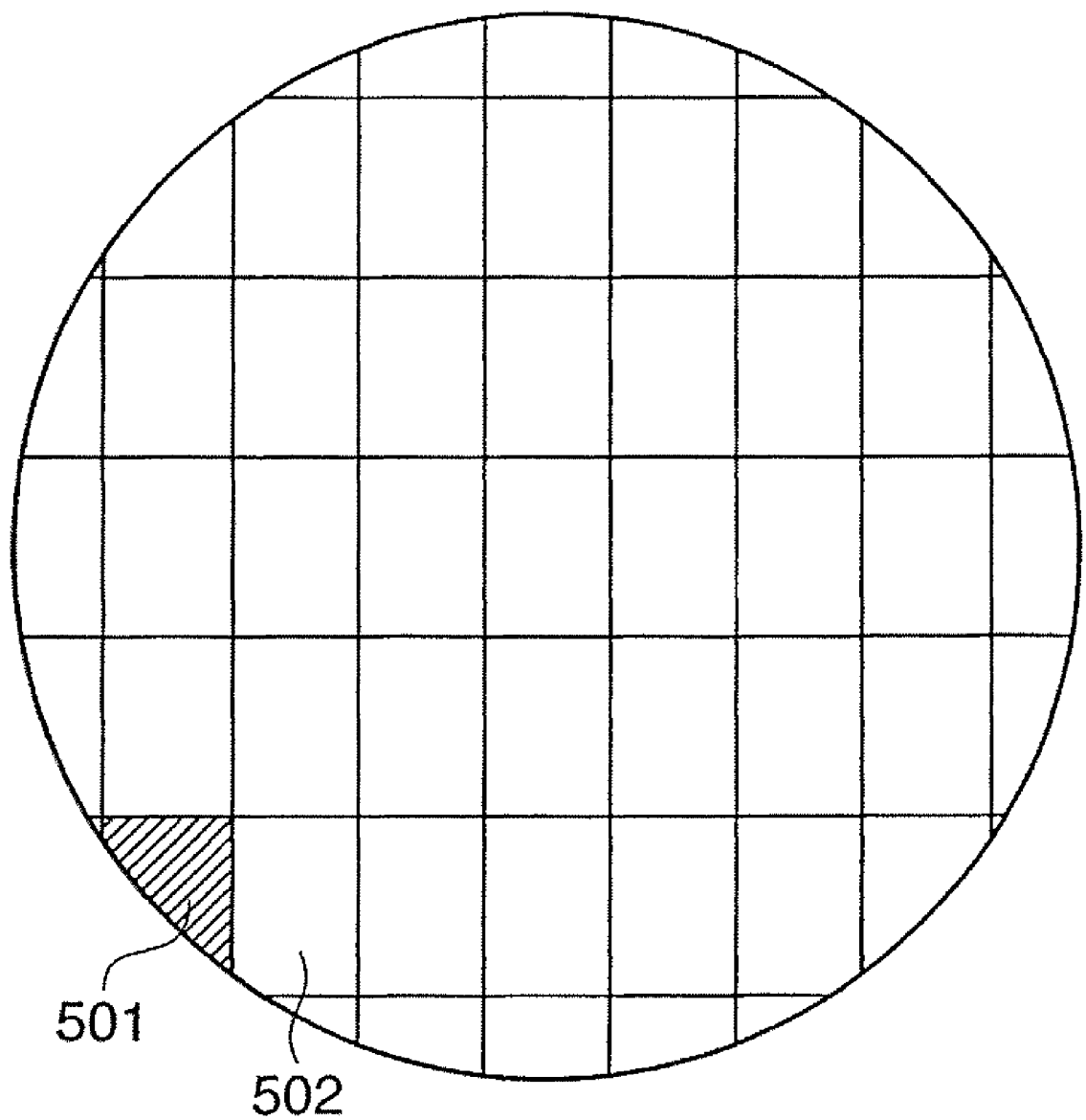
FIG. 5 is a view showing a shot layout on the substrate.
Figure 6:
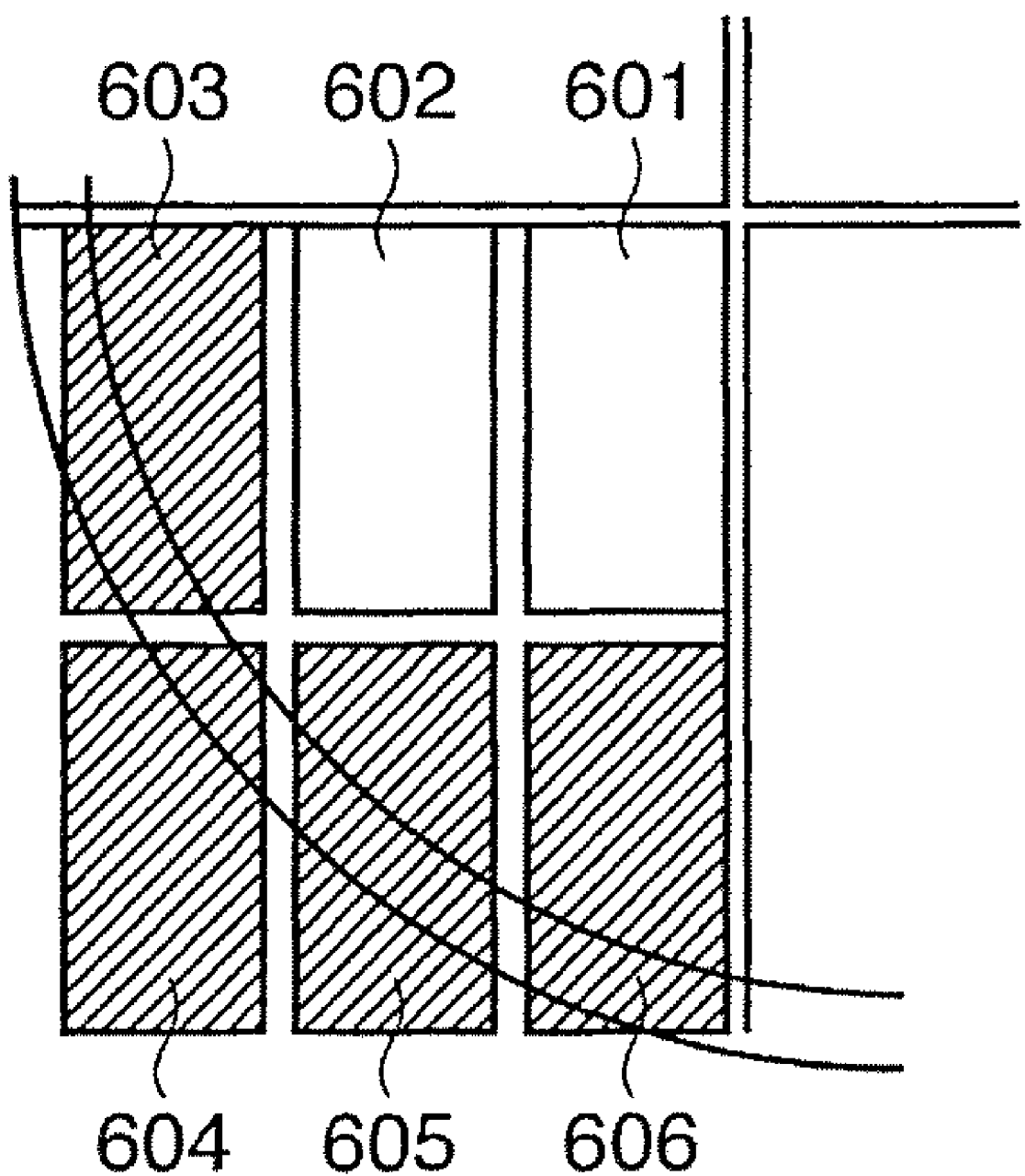
FIG. 6 is a partial enlarged view of FIG. 5.

FIG. 5 shows the shot layout on the substrate when 3×2=6 chips are grouped in one shot region. Referring to FIG. 5, the cross-hatched shot region partially falls outside the substrate. FIG. 6 is an enlarged view of this shot region. Referring to FIG. 6, cross-hatched chips 603 to 606 are invalid chips because they partially fall outside the substrate, whereas chips 601 and 602 are valid chips. Therefore, some shot regions are exposed while partially falling outside the substrate in its periphery.

Figure 7A:
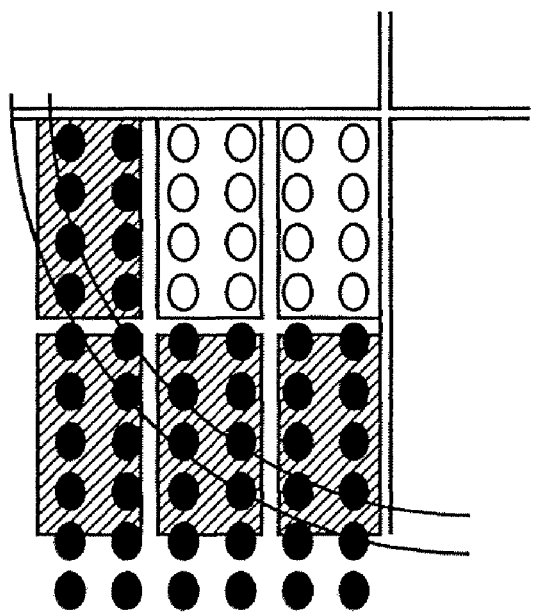
FIGS. 7A and 7B are views for explaining the mechanical tolerance/adjustment tolerance of the measurement point arrangement.

FIG. 7A shows surface position measurement when attention is focused on valid chips. Referring to FIG. 7A, the open circles and filled circles indicate surface position measurement points in a shot region 501 in the shot layout shown in FIG. 5. The open circles and filled circles indicate valid measurement point positions and invalid measurement point positions, respectively.

For example, the measurement point position is determined from the measurement interval in a shot region and the amount of change in measurement timing between adjacent shot regions based on the arrangement interval of measurement points, the size of a scan measurement region, shot layout information, the scan speed, and the CCD accumulation time. After that, the validity is determined for each measurement point based on information on valid areas for each shot region, which is set via the console 140. The information on valid areas for each shot region can be input via, for example, a console. It is also possible to provide the information on valid areas for each shot region via a communication line.

Figure 12:
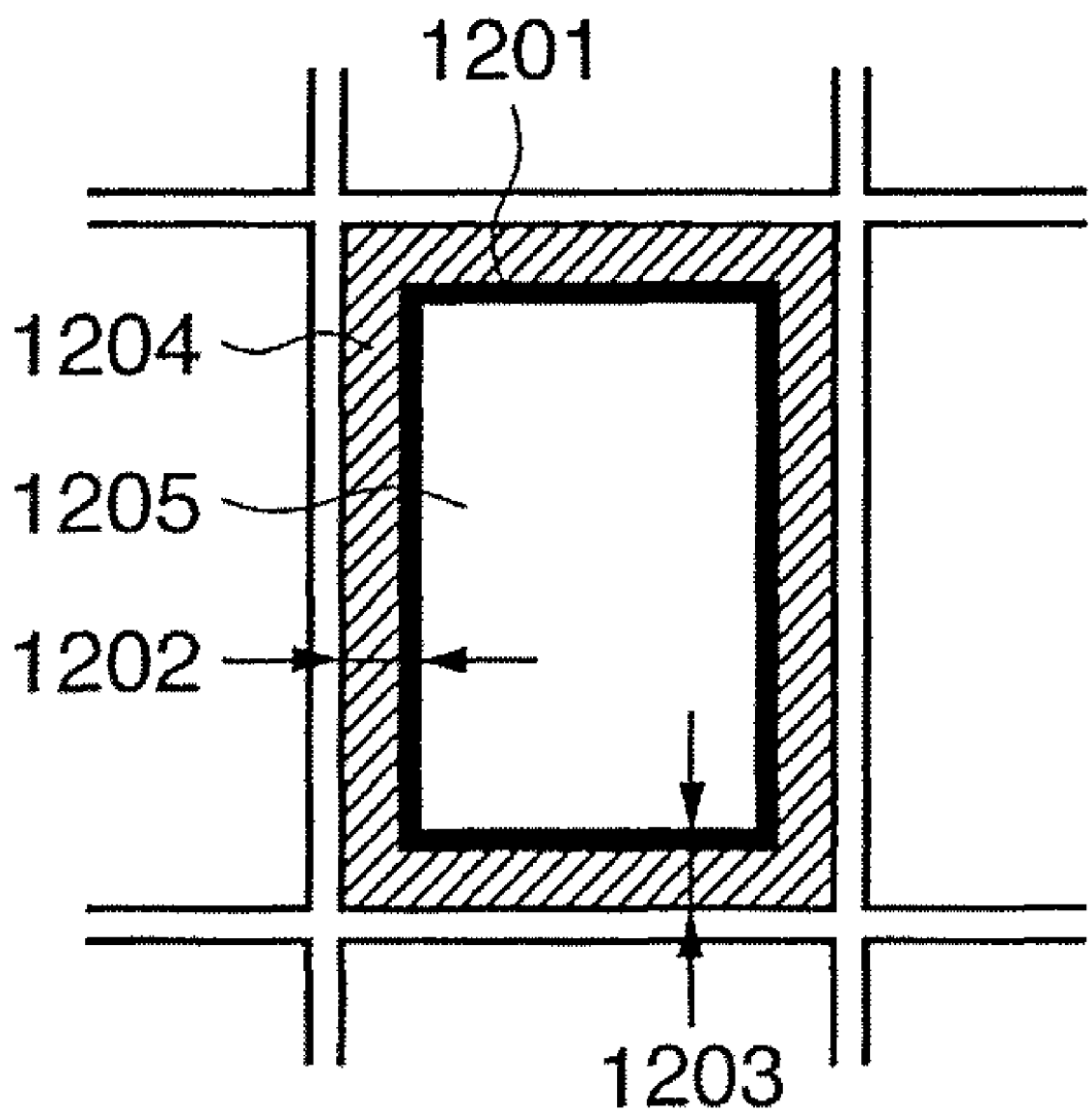
FIG. 12 is a conceptual view showing a boundary line arrangement which determines the validity of a measurement point in a shot.
Figure 13A:
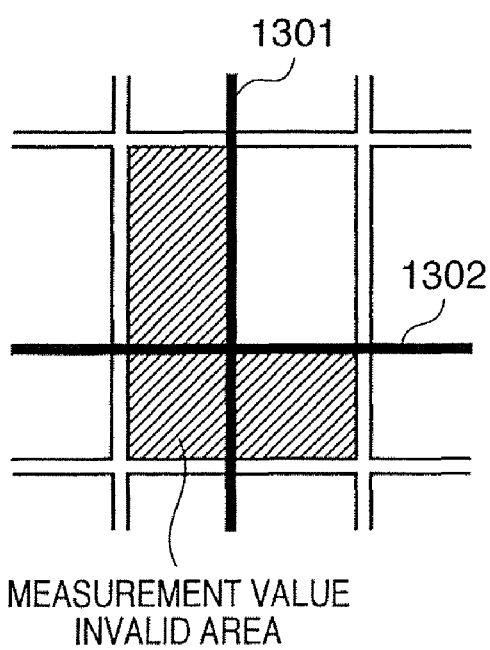
FIGS. 13A and 13B are conceptual views showing boundary line arrangements which determine the validity of a measurement point in a shot.
Figure 13B:
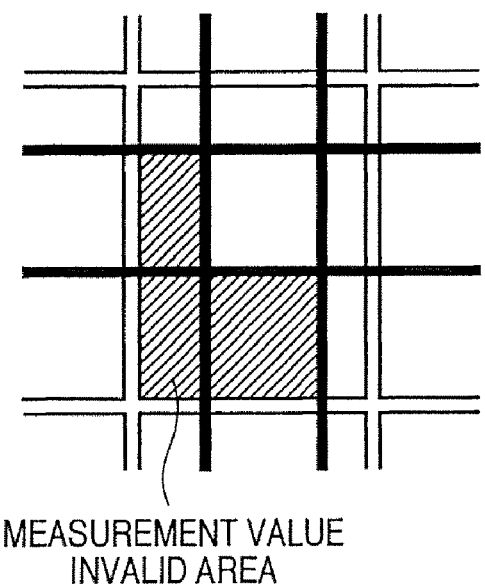

FIGS. 12, 13A, and 13B exemplify the measurement value valid area for determining the validity of a measurement point in a shot region. Referring to FIGS. 12, 13A, and 13B, a shot region is divided into valid areas and invalid areas by its edge and boundary lines. The number of boundary lines used is not particularly limited as long as one or more boundary lines run in at least one of the vertical and horizontal directions. One boundary line is used in each of the vertical and horizontal directions in FIG. 13A, while two boundary lines are used in each of the vertical and horizontal directions in FIGS. 12 and 13B. Referring to FIG. 12, only one central white area of nine areas divided by the total of four vertical and horizontal boundary lines is a valid area because areas in the vicinity of the edge of the shot region are excluded. Referring to FIG. 13A, one upper right white area of four areas divided by the total of two vertical and horizontal boundary lines is a valid area. Referring to FIG. 13B, six upper right white areas of nine areas divided by the total of four vertical and horizontal boundary lines are valid areas. In this embodiment of the present invention, the validity of each measurement point is simply set using boundary lines in this way.

When a measurement point is positioned in an invalid area, the controller 111 does not use this measurement point to determine the surface position. The controller 111 calculates and determines the surface position on the basis of the surface position measurement result obtained at each measurement point in a valid area.

Figure 4:
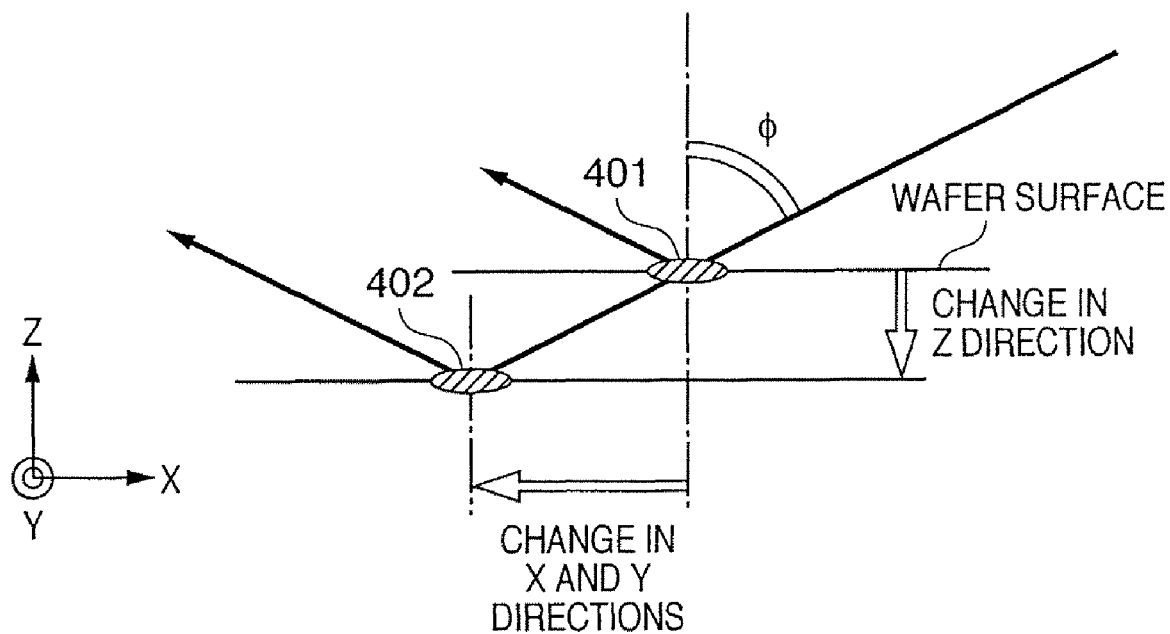
FIG. 4 is a view for explaining the principle as to how the position of a measurement point in the in-plane direction changes depending on a change in the position of the substrate surface.
Figure 7B:
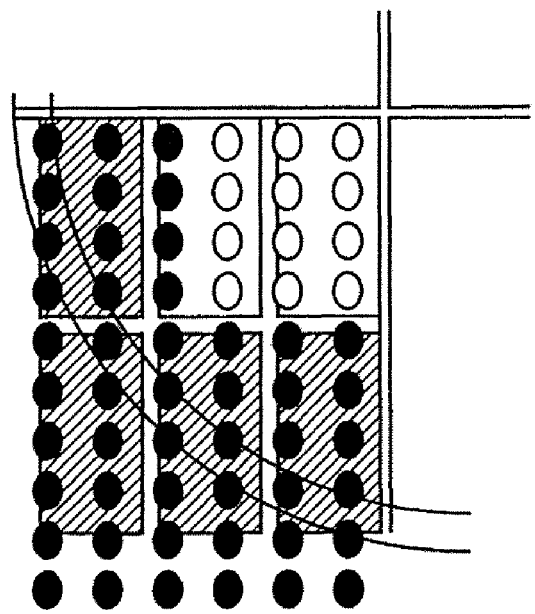
Figure 11:
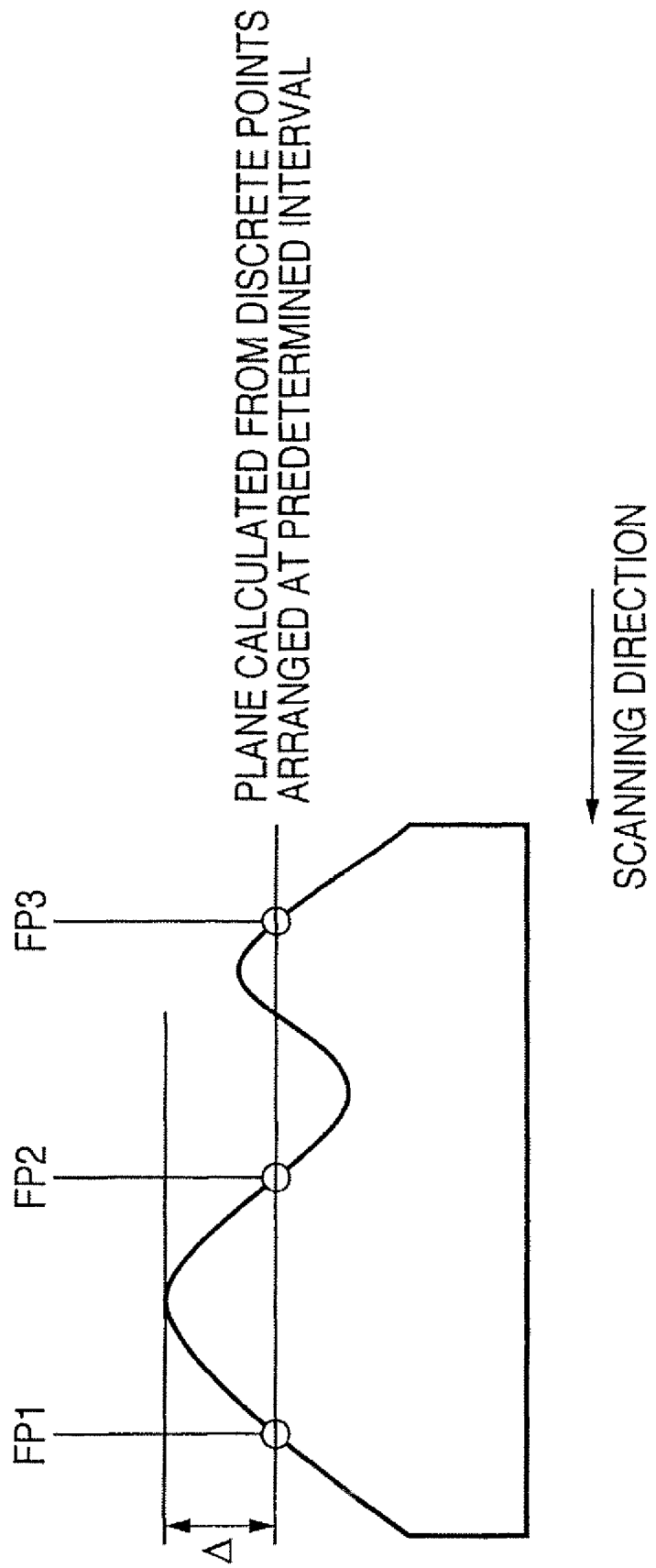
FIG. 11 is a diagram showing a sampling error of the measurement point arrangement with respect to the substrate surface shape.

FIG. 7B exemplifies the measurement point arrangement in another surface position measuring device. The positions of measurement points in the in-plane direction are influenced by individual variations such as the mechanical tolerance and adjustment error for each surface position measuring device, and a change in measurement point position in the X and Y directions which has occurred depending on that in the Z direction in an oblique-incident-light surface position measuring device as shown in FIG. 4. FIG. 4 is a view for explaining the amount of change in the X and Y directions with respect to that in the Z direction at an incident angle $\Phi$. A measured substrate surface position 401 shifts to a point 402 by Z×tan $\Phi$ in the X and Y directions as the substrate surface position changes in the Z direction. For example, tan $\Phi$=2.747 when $\Phi$=70°, while tan $\Phi$=11.430 or more when $\Phi$=85° or more. Therefore, when a change in measurement value in the Z direction is large, X and Y measurement values corresponding to this Z measurement value cannot be used directly because errors have a significant influence.

To cope with the influence of such individual variations, substrate surface level information in measurement, and the orientation of the stage mounting a substrate, a method of determining the validity of a measurement point can be changed using boundary lines. This method will be explained with reference to FIG. 12. An area 1204 surrounded by two vertical and horizontal boundary lines 1201 and the edge of the shot region is an invalid area. Reference numerals 1202 and 1203 in FIG. 12 indicate the horizontal and vertical widths which define the range of the invalid area 1204. The controller 111 corrects the position of a measurement point in the in-plane direction based on a Z measurement result indicating the level. The controller 111 determines the validity of the measurement point based on its corrected position in the in-plane direction. The controller 111 calculates and determines the surface position for each shot region based on the substrate surface position at each measurement point determined to fall within a valid area.

As described above, the controller 111 determines the validity of each measurement point in a shot region based on boundary lines which divide the shot region into valid areas and invalid areas, and information on the measured substrate surface level. The measurement result obtained at a measurement point determined to be invalid is not used for surface position calculation. The controller 111 calculates and determines the surface position for each shot region on the basis of only the measurement result obtained at each measurement point determined to be valid.

In step 806, the controller 111 stores information on the surface position for each shot determined in step 805.

In step 807, the substrate is loaded on the exposure stage while being chucked by the substrate chuck. In step 808, the exposure stage is driven to focus using the reticle focusing mark and the reference plane on the substrate chuck. In step 809, the substrate is exposed to light while controlling the position of the substrate stage so as to align the shot region in each shot with the image plane, based on information on the previously determined surface position with respect to the reference plane on the substrate chuck.

In step 810, the main control unit 110 determines whether the exposure of all the shots on the substrate is complete. If exposure is not complete, the process returns to step 809 to repeat exposure for each shot with alternate scanning and correction to align each shot region with the image plane. After completing the exposure of all the shots, the substrate is unloaded from the exposure stage in step 811. In step 812, the series of exposure sequences is completed.

Figure 14:
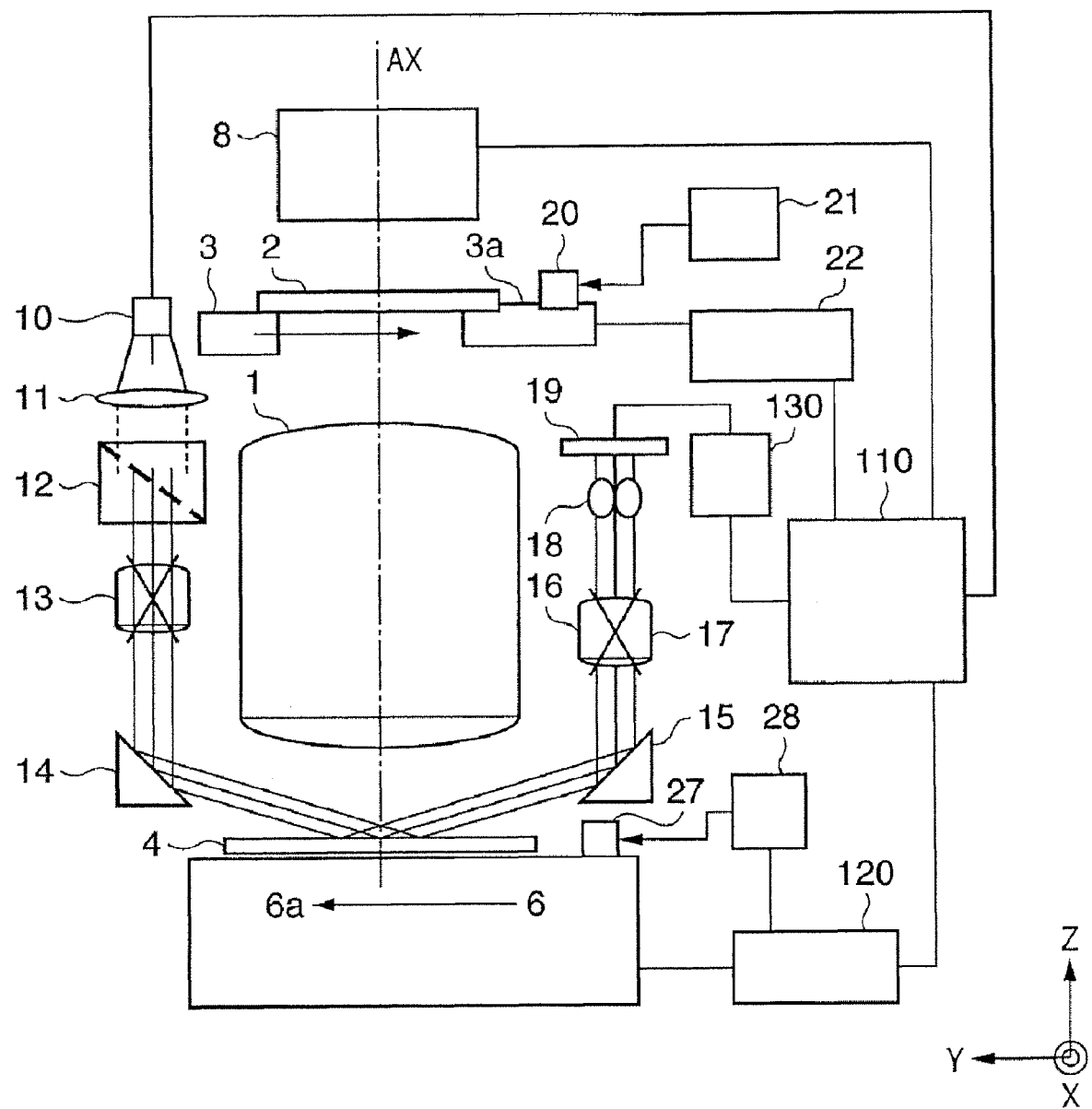
FIG. 14 is a schematic partial view showing an example of a projection exposure apparatus of a slit/scan scheme using a surface position measurement method.

In this embodiment, as shown in FIG. 1, the exposure apparatus separately has the measurement stage and the exposure stage. However, establishing a so-called off-line system makes it possible to adopt a plurality of scanning exposure apparatuses or an exposure apparatus having one measurement stage and a plurality of exposure stages. Similarly, a single stage type scanning exposure apparatus as shown in FIG. 14 can be adopted.

In the above description, steps 801 to 812 shown in FIG. 8 are a series of processes. However, as is obvious from that the exposure apparatus separately has the measurement stage and the exposure stage, it is reasonably possible to load the next substrate on the measurement stage to perform processes in step 801 to 806, parallel to scanning exposure subsequent to step 807. In this case, the substrates can be economically, continuously processed, thus attaining efficient substrate exposure.

Embodiment of Device Manufacture

Figure 15:
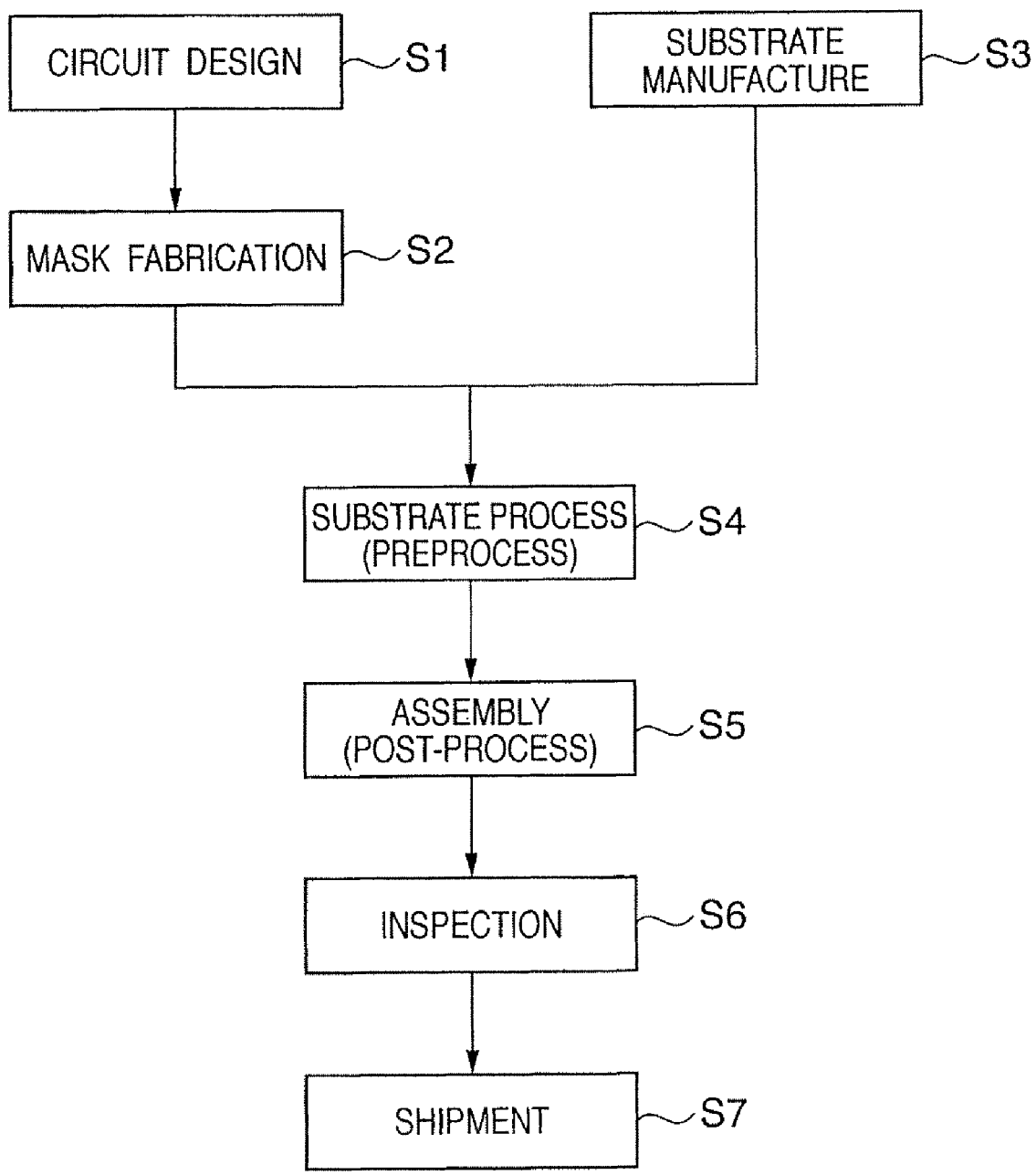
FIG. 15 is a flowchart for explaining device manufacture using an exposure apparatus.

An embodiment of a method of manufacturing a device using the above-described exposure apparatus will be explained next with reference to FIGS. 15 and 16. FIG. 15 is a flowchart for explaining the manufacture of a device (e.g., a semiconductor chip such as an IC or LSI, an LCD, or a CCD). A method of manufacturing a semiconductor chip will be exemplified here.

In step S1 (circuit design), the circuit of a semiconductor device is designed. In step S2 (mask fabrication), a mask is fabricated based on the designed circuit pattern. In step S3 (substrate manufacture), a substrate is manufactured using a material such as silicon. In step S4 (substrate process) called a preprocess, the above-described exposure apparatus forms an actual circuit on the substrate by lithography using the mask and substrate. In step S5 (assembly) called a postprocess, a semiconductor chip is formed using the substrate manufactured in step S4. This step includes an assembly step (dicing and bonding) and packaging step (chip encapsulation). In step S6 (inspection), the semiconductor device manufactured in step S5 undergoes inspections such as an operation confirmation test and durability test. After these steps, the semiconductor device is completed and shipped in step S7.

Figure 16:
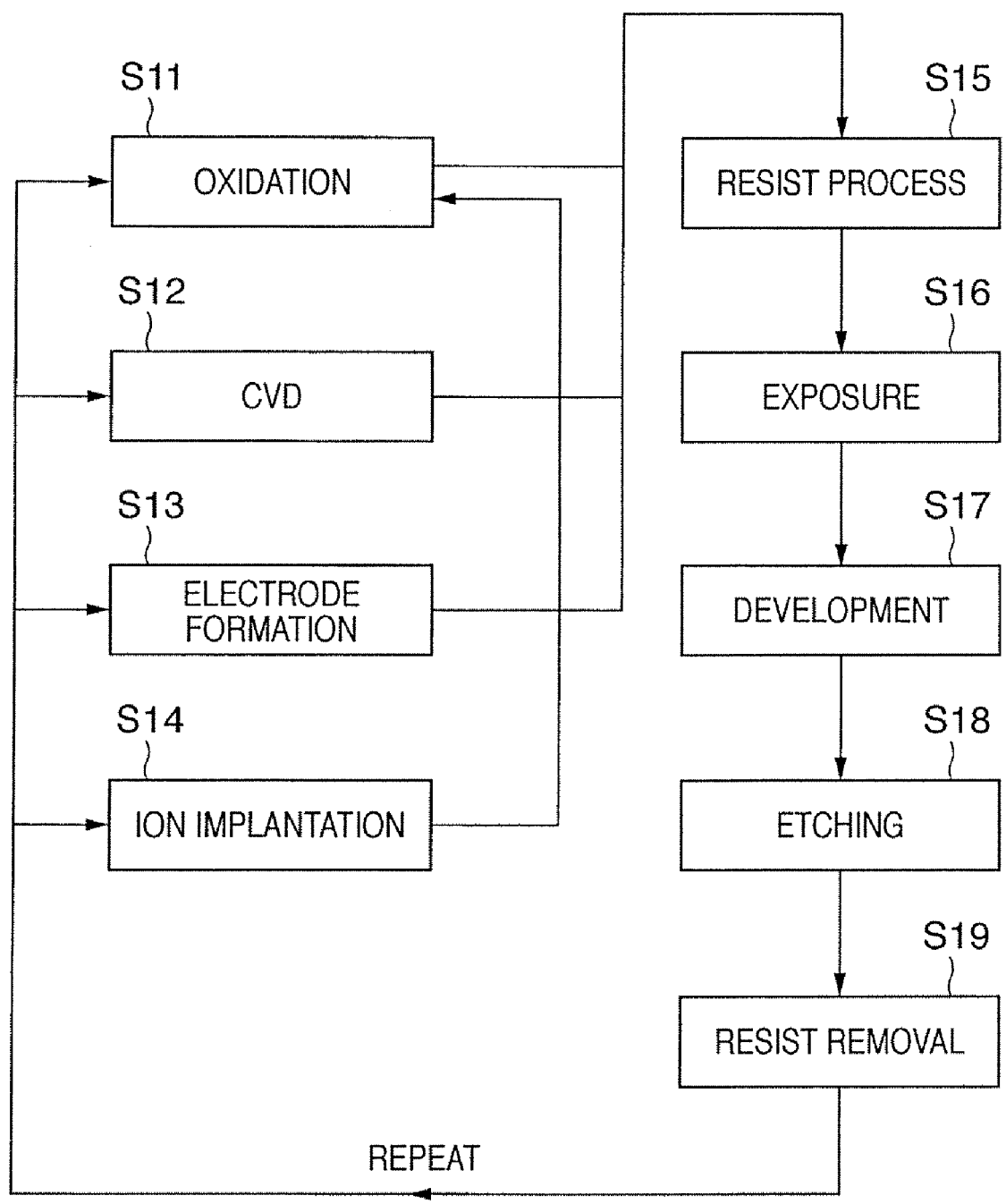
FIG. 16 is a flowchart illustrating details of the substrate process in step S4 of the flowchart illustrated in FIG. 15.

FIG. 16 is a flowchart illustrating details of the substrate process in step S4. In step S11 (oxidation), the substrate surface is oxidized. In step S12 (CVD), an insulating film is formed on the substrate surface. In step S13 (electrode formation), an electrode is formed on the substrate by deposition. In step S14 (ion implantation), ions are implanted into the substrate. In step S15 (resist process), a photosensitive agent is applied to the substrate. In step S16 (exposure), the above-described exposure apparatus transfers the circuit pattern of the mask onto the substrate by exposure. In step S17 (development), the exposed substrate is developed. In step S18 (etching), portions other than the developed resist image are etched. In step S19 (resist removal), any unnecessary resist remaining after etching is removed. By repeating these steps, a multilayered structure of circuit patterns is formed on the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-322518, filed Nov. 29, 2006, which is hereby incorporated by reference herein in its entirety.

What is claimed is:

1. An exposure apparatus which includes a projection optical system for projecting light from a reticle onto a substrate, and exposes a shot region of the substrate to radiant energy via the reticle and the projection optical system, the apparatus comprising:

a substrate stage configured to hold the substrate and to be moved;

a measuring device configured to measure a position of a surface of the shot region in a direction parallel to an optical axis of the projection optical system with respect to a measurement point on the surface;

a console configured to set a valid area with respect to each shot region, the valid area being set such that the valid area is narrower than a corresponding shot region, and that the measurement point in the valid area is a valid measurement point; and a controller configured to control a position of the substrate stage in the direction based on the position of the surface measured by the measuring device with respect to the valid measurement point, the controller being configured to determine the valid measurement point based on a position of the shot region relative to the measuring device and the valid area set by the console with respect to the shot region.

2. An apparatus according to claim 1, wherein the controller is configured to determine the valid measurement point based on the position of the surface measured by the measuring device.

3. A method of manufacturing a device, the method comprising:

exposing a substrate to radiant energy using an exposure apparatus which includes a projection optical system for projecting light from a reticle onto a substrate, and exposes a shot region of the substrate to radiant energy via the reticle and the projection optical system, the apparatus comprising: a substrate stage configured to hold the substrate and to be moved; a measuring device configured to measure a position of a surface of the shot region in a direction parallel to an optical axis of the projection optical system with respect to a measurement point on the surface; a console configured to set a valid area with respect to each shot region, the valid area being set such that the valid area is narrower than a corresponding shot region, and that the measurement point in the valid area is a valid measurement point; and a controller configured to control a position of the substrate stage in the direction based on the position of the surface measured by the measuring device with respect to the valid measurement point, the controller being configured to determine the valid measurement point based on a position of the shot region relative to the measuring device and the valid area set by the console with respect to the shot region;

developing the exposed substrate; and processing the developed substrate to manufacture the device.

\* \* \* \* \*